United States Patent [19]
Patel et al.

[11] Patent Number: 5,659,372
[45] Date of Patent: Aug. 19, 1997

[54] DIGITAL TV DETECTOR RESPONDING TO FINAL-IF SIGNAL WITH VESTIGIAL SIDEBAND BELOW FULL SIDEBAND IN FREQUENCY

[75] Inventors: C. B. Patel, Hopewell, N.J.; Allen LeRoy Limberg, Vienna, Va.

[73] Assignee: Samsung Electronics Co., Ltd., Kyungki-do, Rep. of Korea

[21] Appl. No.: 577,763

[22] Filed: Dec. 22, 1995

[51] Int. Cl.$^6$ ................................................. H04N 5/455
[52] U.S. Cl. ........................... 348/731; 348/475; 348/537; 348/726; 375/331; 375/340
[58] Field of Search ............................. 348/725, 731, 348/726, 470, 475, 536, 537, 735; 375/270, 321, 326, 339, 340, 344; 329/356, 357; 455/202, 204, 314, 323, 324; H04N 7/08, 5/455

[56] References Cited

U.S. PATENT DOCUMENTS 4,048,572  9/1977  Dogliotti .............................. 455/204
5,422,889  6/1995  Sevenhans ........................... 455/324

*Primary Examiner*—John K. Peng
*Assistant Examiner*—Jeffrey S. Murrell
*Attorney, Agent, or Firm*—Sughrue, Mion, Zinn, Macpeak & Seas

[57] ABSTRACT

A tuner selects one of channels at different locations in a frequency band used for transmitting VSB HDTV signals including symbol codes descriptive of digital signals. The tuner also includes mixers for performing plural conversion of the selected channel to a final intermediate-frequency signal, which is digitized by an analog-to-digital converter. A phase tracker, operative on narrow-bandpass filtered portions of the digitized final intermediate-frequency signal centering on its carrier frequency, suppresses an imaginary portion of the final intermediate-frequency signal, arising from multipath distortion or from phase incoherence in local oscillations used during frequency conversion(s). A digital controlled oscillator in the phase tracker supplies digital descriptions of the carrier wave for a real portion of the final intermediate-frequency signal to a synchronous detector, which synchronous detector detects the real portion of the digitized final intermediate-frequency signal in accordance with those digital descriptions of the carrier wave. The mixers in the tuner provide for the final-IF signal supplied to the analog-to-digital converter to have its lowest frequencies substantially above zero frequency, to have a vestigial sideband below its carrier frequency, and to have a full sideband above its carrier frequency. Because the vestigial sideband is below the carrier of the final-IF signal in frequency, the carrier is closer to zero frequency, so there are more samples per cycle for given sampling rate. This improves the accuracy of the phase tracking in the digital circuitry for synchrodyning the digitized final intermediate-frequency signal to baseband, particularly when the sampling rate for digitization is chosen close to Nyquist rate.

42 Claims, 9 Drawing Sheets

DIGITAL TV DETECTOR RESPONDING TO FINAL-IF SIGNAL WITH VESTIGIAL SIDEBAND BELOW FULL SIDEBAND IN FREQUENCY

The invention relates to the detection of vestigial sideband information in the digital regime, especially as it relates to digital high-definition television (HDTV) signal radio receivers.

BACKGROUND OF THE INVENTION

Vestigial sideband (VSB) signals that are used in certain transmissions of HDTV signal have their natural carrier wave, which would vary in amplitude depending on the percentage of modulation, replaced by a pilot carrier wave of fixed amplitude, which amplitude corresponds to a prescribed percentage of modulation. Such VSB signals will be used in over-the-air broadcasting within the United States, for example, and can be used in cable-casting systems. Digital HDTV signal radio receivers for these signals have been proposed, which are of a type that uses double-conversion in the tuner followed by synchronous detection. A frequency synthesizer generates first local oscillations that are heterodyned with the received television signals to generate first intermediate frequencies (e.g., with 920 MHz carrier). A passive LC bandpass filter selects these first intermediate frequencies from their image frequencies for amplification by a first intermediate-frequency amplifier, and the amplified first intermediate frequencies are filtered by a first surface-acoustic-wave (SAW) filter that rejects adjacent channel responses. The first intermediate frequencies are heterodyned with second local oscillations to generate second intermediate frequencies (e.g., with 41 MHz carrier), and a second SAW filter selects these second intermediate frequencies from their images and from remnant adjacent channel responses for amplification by a second intermediate-frequency amplifier. The response of the second intermediate-frequency amplifier is synchrodyned to baseband with third local oscillations of fixed frequency.

The third local oscillations of fixed frequency are supplied in 0°- and 90°-phasing, thereby implementing in-phase and quadrature-phase synchronous detection procedures. The in-phase synchronous detection result is eight-level coding of digital symbols when HDTV signals are broadcast, and the quadrature-phase synchronous detection result is nominally zero-valued. Separately digitizing in-phase and quadrature-phase synchronous detection results generated in the analog regime presents problems with regard to the synchronous detection results satisfactorily tracking each other after digitizing; quantization noise introduces pronounced phase errors in the complex signal considered as a phasor. This problem is avoided in HDTV signal radio receivers of the type previously proposed by performing the in-phase and quadrature-phase synchronous detection procedures in the digital regime.

By way of example, the in-phase and quadrature-phase synchronous detection procedures are implemented by sampling the response of the second intermediate-frequency amplifier at twice the Nyquist rate of the eight-level coding when digitizing. The successive samples are considered to be consecutively numbered in order of their occurrence; and odd samples and even samples are separated from each other to generate respective ones of the in-phase (or real) and quadrature-phase (or imaginary) synchronous detection results.

The eight-level coding in the digital in-phase synchronous detection result is filtered to remove co-channel interference from NTSC signals and is subjected to equalization filtering. The equalization filter response is supplied as input signal to a trellis decoder. The response of the trellis decoder is supplied as input signal to a data de-interleaver, and the de-interleaved data are supplied to a Reed-Solomon decoder. Error-corrected data are supplied to a data derandomizer which regenerates packets of data for a packet decoder. Selected packets are used to reproduce the audio portions of the HDTV program, and other selected packets are used to reproduce the video portions of the HDTV program.

To implement the synchrodyning used in the in-phase and quadrature-phase synchronous detection procedures, the quadrature-phase synchronous detection results are used to develop automatic-frequency-and-phase-control (AFPC) signals for a controlled oscillator that generates the second local oscillations. The digital quadrature-phase synchronous detection result is low-pass filtered to generate an AFPC signal that adjusts the frequency and phase of the second local oscillations to minimize the amplitude of the quadrature-phase synchronous detection result. In practice however, this automatic frequency and phase control is inadequate in providing the desired degree of phase stability for the in-phase synchronous detection result. The adaptive equalization filtering of the digitized in-phase synchronous detection result can correct for static phase error in the synchrodyning used in the in-phase and quadrature-phase synchronous detection procedures, but the adaptive change in the filter coefficients of the equalization filtering is too slow to compensate for phase jitter in the AFPC feedback loop or for changes in phase error that occur during rapid changes in multipath reception of the HDTV signal.

Accordingly, in HDTV signal radio receivers of the type previously proposed, a phase tracker has been cascaded with the equalization filtering of the digitized in-phase synchronous detection result. The equalized in-phase synchronous detection result is supplied in digitized form to a Hilbert-transform finite-impulse-response filter. The response of this FIR filter and the equalized in-phase synchronous detection, as delayed to compensate for the latency of the Hilbert-transform FIR filter, are applied as real and imaginary input signals to a complex-number multiplier, to be multiplied by a complex-number multiplier signal for generating a complex-number product. A feedback loop ascertains the departure of the imaginary component of the complex-number product from zero to develop an error signal for adjusting the phase angle of the unit Euler vector used as the complex-number multiplier signal. The real and imaginary values of the unit Euler vector are drawn from a sine/cosine look-up table (LUT) stored in read-only memory (ROM) addressed by the output of an accumulator used for integrating the error signal. A problem with this phase tracker is that the Hilbert-transform FIR filter has to have many, many taps in order to provide the requisite 90° of phase shift at close to zero frequencies.

Modifications of the HDTV signal radio receiver described above are described and claimed by the inventors in a U.S. patent application Ser. No. 08/237,896 filed 4 May 1994, now U.S. Pat. No. 5,479,499 issued Dec. 26, 1995 and entitled DIGITAL VSB DETECTOR WITH BANDPASS PHASE TRACKER, AS FOR INCLUSION IN AN HDTV RECEIVER, which is incorporated herein by reference and which may be constructed in accordance with the invention claimed herein. In the modified HDTV signal radio receiver the second local oscillations, which are heterodyned with the first intermediate frequencies to convert them to second intermediate frequencies, are of a fixed frequency. Accordingly, phase jitter in the AFPC feedback loop of a controlled oscillator is eliminated as a problem in the generation of the second local oscillations. Third local oscillations at a fixed frequency offset from the frequency of the carrier for the second intermediate frequencies are heterodyned with the second intermediate frequencies to downconvert them to third intermediate frequencies, rather than synchrodyning with the second intermediate frequencies to downconvert them to baseband. The third intermediate frequencies are then digitized with a bandpass, rather than baseband, analog-to-digital converter; and the rest of the detection procedures are carried out in the digital regime. The third intermediate frequencies will still exhibit changes in phase error that occur during rapid changes in multipath reception of the HDTV signal, so a phase tracker is still desirable. The phase tracker is implemented at the third intermediate frequencies during complex synchronous detection, and is therefore implemented before equalization filtering, rather than the phase tracker being implemented after complex synchronous detection and equalization filtering as in the prior-art receiver. The phase tracker is a bandpass phase tracker, rather than the baseband (or lowpass) phase tracker used in the prior-art receiver.

The in-phase and quadrature-phase sampling procedures used in the bandpass phase tracker are adapted from ones previously used for complex synchronous detection of digitized bandpass signals having symmetrical sideband structures. HDTV signals for over-the-air broadcasting are vestigial sideband (VSB) amplitude-modulation signals, rather than double sideband (DSB) amplitude-modulation signals, and have asymmetrical sideband structures. The complex synchronous detection of the HDTV signals, used for developing error signal in the bandpass phase tracker, must be sufficiently restricted in bandwidth that response is to a symmetrical sideband structure contained within the asymmetrical sideband structure of the VSB signal. The synchronous detection of the HDTV signals to recover the eight-level (or 16-level) VSB coding is not so restricted in bandwidth.

The in-phase and quadrature-phase sampling procedures used by the inventors in the bandpass phase tracker described in U. S. patent application Ser. No. 08/237,896 are generally similar to those described by D. W. Rice and K. H. Wu in their article "Quadrature Sampling with High Dynamic Range" on pp. 736–739 of IEEE TRANSACTIONS ON AEROSPACE AND ELECTRONIC SYSTEMS, Vol. AES-18, No. 4 (November 1982), for example. Rice and Wu point out that the bandpass signals need to be sampled before digitization at or above the Nyquist rate, as determined by the bandwidth of the bandpass signal and not by the highest frequency component of the bandpass signal. Quadrature-phase synchronous detection is performed using a Hilbert-transform FIR filter on the digitized bandpass signals; in-phase synchronous detection is performed after compensating delay equal to the latency time of the Hilbert-transform FIR filter. Rice and Wu point out that performing complex synchronous detection on digitized bandpass signals has the advantage that the direct components introduced by the mixer are suppressed by the bandpass filter and do not affect digitization. In the complex synchronous detection of digitized VSB signals in bandpass form, the direct component of the complex synchronous detection result arising from the partially suppressed carrier wave is unaffected by the direct components introduced by the mixer, which is important in the inventions disclosed herein. Advantages other than those disclosed by Rice and Wu result from Hilbert transforming digitized bandpass signals, rather than digitized baseband signals. The Hilbert-transform FIR filter no longer has to provide 90° of phase shift at close to zero frequencies, where very long delay is required for providing 90° of phase shift. The Hilbert-transform FIR filter only has to provide 90° of phase shift above a megahertz or two, where delay requirements are modest, up to a frequency of seven to eight megahertz. The relatively small ratio between the uppermost response frequency and the lowermost response frequency required of the filter keeps the number of taps required in the filter relatively low.

In U.S. patent application Ser. No. 08/237,896 the inventors indicated that other embodiments of their invention are possible wherein the in-phase and quadrature-phase sampling procedures used in the bandpass phase tracker are implemented by other types of paired all-pass digital filters that exhibit a constant $\pi/2$ difference in phase response for the digitized bandpass signals. As disclosed in U.S. patent application Ser. No. 08/237,896, C. M. Rader in his article "A Simple Method for Sampling In-Phase and Quadrature Components", IEEE TRANSACTIONS ON AEROSPACE AND ELECTRONIC SYSTEMS, Vol. AES-20, No. 6 (November 1984), pp. 821–824, describes improvements in complex synchronous detection carried out on digitized bandpass signals. Rader replaces the Hilbert-transform FIR filter and the compensating-delay FIR filter of Rice and Wu with a pair of all-pass digital filters designed based on Jacobjan elliptic functions and exhibiting a constant $\pi/2$ difference in phase response for the digitized bandpass signals. A preferred pair of such all-pass digital filters has the following system functions:

$$H_1(z) = z^{-1}(z^{-2} - a^2)/(1 - a^2 z^{-2}) \quad a^2 = 0.5846832$$

$$H_2(z) = -(z^{-2} - b^2)/(1 - b^2 z^{-2}) \quad b^2 = 0.1380250$$

Rader describes filter configurations which require only two multiplications, one by $a^2$ and one by $b^2$.

SUMMARY OF THE INVENTION

A digital television receiver for digital television signals comprises a tuner for selecting one of channels at different locations in a frequency band and frequency converting the selected channel to a final intermediate-frequency signal in a final intermediate-frequency band which has its lowest frequencies above zero frequency; an analog-to-digital converter for digitizing the final intermediate-frequency signal; and digital circuitry for synchrodyning the digitized final intermediate-frequency signal to baseband. Each of the received digital television signals has a pilot carrier, has a vestigial sideband below the frequency of its pilot carrier, and has a full sideband above the frequency of its pilot carrier. The mixing procedures performed in the tuner for translating the frequencies of the received digital television signals to the final intermediate-frequency signal are performed so that supplied to the analog-to-digital converter for digitization has a vestigial sideband below its carrier frequency and has a full sideband above its carrier frequency. Because the vestigial sideband is below the carrier of the final-IF signal in frequency, the carrier is closer to zero frequency, so there are more samples per cycle for given sampling rate. This improves the accuracy of the phase tracking in the digital circuitry for synchrodyning the digitized final intermediate-frequency signal to baseband, particularly when the sampling rate for digitization is chosen close to Nyquist rate.

In the block schematic diagrams clock or control signal connections are shown in dashed line, where it is desired to distinguish them from connections for the signals being controlled.

DETAILED DESCRIPTION

Figure 1:
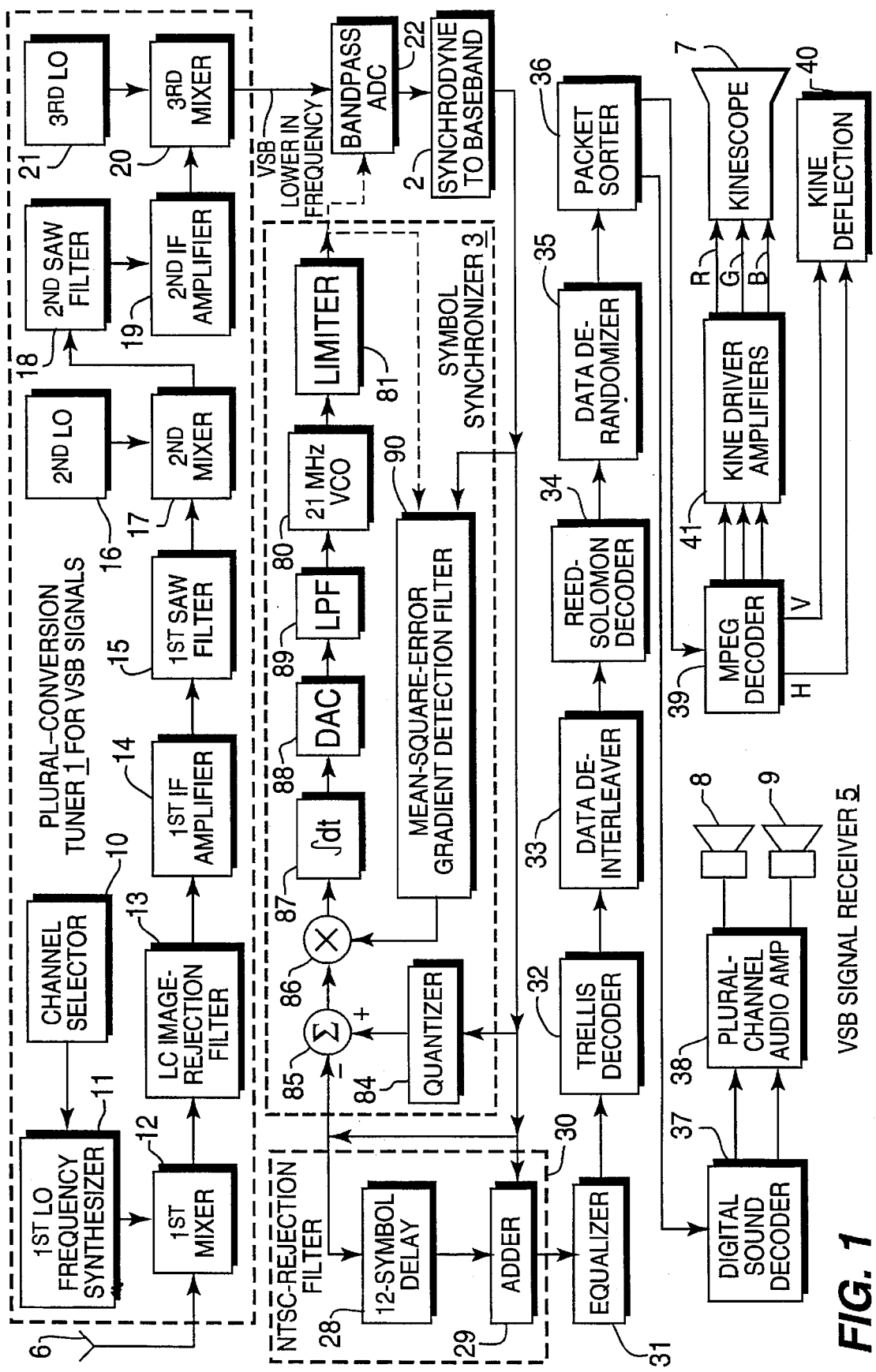
FIG. 1 is a block schematic diagram of a receiver for VSB signal with a pilot carrier component, which receiver uses digital circuitry for synchrodyning symbols to baseband and is of the general type in which the invention may be embodied.

FIG. 1 shows a VSB signal receiver 5 for receiving digital HDTV signals from a broadcast receiving antenna 6. This receiver 5 recovers red (R), green (G) and blue (B) drive signals for a kinescope 7 and recovers stereophonic sound signals for driving left and right loudspeakers 8 and 9. Alternatively, the VSB signal receiver 5 can be connected for receiving digital HDTV signals from a narrowcast receiving antenna or from a cablecast transmission system. A different display device may be used instead of the kinescope 7, and the sound recovery system may be different, consisting of but a single audio channel or being more elaborate than a simple stereophonic reproduction system.

A tuner 1 comprising elements 11-21 selects one of channels at different locations in the frequency band for the received VSB signals, such as the digital HDTV signals captured by the broadcast receiving antenna 6, and performs plural frequency conversion of the selected channel to a final intermediate-frequency signal in a final intermediate-frequency band. More particularly, a channel selector 10 designed for operation by a human being determines the frequency of first local oscillations that a frequency synthesizer 11, which functions as a first local oscillator, furnishes to a first mixer 12 for heterodyning with received signals as supplied from the broadcast receiving antenna 6 or other digital HDTV signal source. The first mixer 12 upconverts the received signals in the selected channel to prescribed first intermediate frequencies (e.g., with 920 MHz carrier) and an LC filter 13 is used to reject the unwanted image frequencies that accompany the upconversion result supplied from the first mixer 12. The first intermediate frequencies resulting from the upconversion are supplied as input signal to a first intermediate-frequency amplifier 14, which supplies amplified first intermediate frequencies for driving a first surface-acoustic-wave (SAW) filter 15. The upconversion to the rather high-frequency first intermediate frequencies facilitates SAW filtering having a large number of poles and zeroes. Second local oscillations from a second local oscillator 16 are supplied to a second mixer 17 for heterodyning with the response of the first SAW filter 15, to generate second intermediate frequencies (e.g., with 41 MHz carrier). A second SAW filter 18 is used for rejecting the unwanted image frequencies that accompany the upconversion result supplied from the second mixer 17. The response of the second SAW filter 18 is supplied as input signal to a second intermediate-frequency amplifier 19, the amplified second intermediate-frequency signal response of which is supplied as input signal to a third mixer 20 there to be heterodyned with oscillations from a third local oscillator 21. The plural-conversion tuner 1 as thusfar described resembles those previously proposed by others, except that the frequency of the oscillations from the third local oscillator 21 is chosen such that the third mixer 20 supplies a third intermediate-frequency signal response with the vestigial sideband extending down to a frequency of one to two MHz and with the full sideband extending up to a frequency of seven to eight MHz, rather than a baseband signal with zero-frequency carrier as previously proposed. This third intermediate-frequency signal response is the final intermediate-frequency output signal of the tuner 1.

An analog-to-digital converter (ADC) 22 samples the final intermediate-frequency output signal of the tuner 1, the duration of each of the analog samples being no longer than a half cycle of the highest final intermediate frequency so as to avoid undesirable aliasing, and digitizes the samples to digital samples having 10-bit resolution, or so. The lowpass filter that is included, per customary practice, in the ADC 22 suppresses the high-frequency image of the third intermediate-frequency signal response from the third mixer 20. The second SAW filter 18 has already restricted the bandwidth of the third intermediate-frequency signals presented to the ADC 22 to be digitized, so the ADC 22 functions as a bandpass analog-to-digital converter for supplying digitized final IF signal to digital circuitry 2 for synchrodyning VSB signals to baseband. The construction of the circuitry 2 in accordance with various embodiments of the invention will be described further on in this specification with reference to FIGS. 2, 3, 4 and 5 of the drawing. The sampling rate used by the ADC 22 during digitization is at least the Nyquist rate for the bandwidth of the bandpass signal, which is 6 MHz for HDTV signals. In practice the inventors prefer a sampling rate of twice the symbol rate for the VSB HDTV signals or about $21 \cdot 10^6$ samples per second.

Sampling at twice the symbol rate for the VSB HDTV signals is done to accommodate symbol synchronization circuitry 3 for synchronizing the sampling by the ADC 22 with the symbol rate, so as to maximize the "eye" response. The symbol synchronization circuitry 3 is of the same general type as S. U. H. Qureshi described for use with pulse amplitude modulation (PAM) signals in his paper "Timing Recovery for Equalized Partial-Response Systems, IEEE Transsynions on Communications, December 1976, pp. 1326–13330. The symbol synchronization circuitry 3 is of the specific type described by the inventors in their earlier-filed U.S. patent application entitled DIGITAL VSB DETECTOR WITH BANDPASS PHASE TRACKER, AS FOR INCLUSION IN AN HDTV RECEIVER. A voltage-controlled oscillator 80 generates cissoidal oscillations nominally of 21 MHz frequency. The oscillator 80 is preferably a crystal oscillator capable of frequency control over a relatively narrow range. A symmetrical clipper or limiter 81 generates a squarewave response to these cissoidal oscillations, which is used as clock signal by the ADC 22 as a step in the digitization procedure which follows the initial step of filtering to limit bandwidth. The generation of the error signal for controlling the frequency and phase of the cissoidal oscillations generated by the VCO 80 will now be considered in some detail.

The samples from the digital circuitry 2 for synchrodyning VSB signals to baseband are supplied to a quantizer 84, which supplies the quantization level most closely approximated by the sample currently received by the quantizer 84 as input signal. This quantization level has the quantizer 84 input signal subtracted therefrom by a digital adder/subtractor 85. The difference signal from the subtractor 85 is indicative of the correction required to correct for error in the symbols as detected, but does not indicate whether the error arising from the sampling at the VSB signal receiver 5 being misphased is due to sampling too early or too late in time.

The samples from the digital circuitry 2 for synchrodyning VSB signals to baseband are applied as input signal to a mean-square-error gradient detection filter 90. The filter 90 is a finite-impulse-response digital filter having a (−½), 1, 0, (−1), (½) kernel, the operation of which is clocked by the squarewave response generated by the symmetrical clipper or limiter 81. The filter 90 response is in temporal alignment with the difference signal from the subtractor 85. A digital multiplier 86 multiplies the difference signal from the subtractor 85 by the filter 90 response to resolve the issue of whether the error arising from the sampling at the VSB signal receiver 5 being misphased is due to sampling too early or too late in time. The sign bit and the next most significant bit of the two's complement response the filter 90 provides are sufficient for the multiplication, which permits simplification of the digital multiplier 86 structure. The product signal from the digital multiplier 86 is supplied to an accumulator 87 for integration, to generate a digital control signal that is converted to an analog control voltage by a digital-to-analog converter 88. A narrowband lowpass filter 89 is used for applying the analog control voltage to the VCO 80.

The baseband response of the digital circuitry 2 for synchrodyning VSB signals to baseband is applied as input signal to a clocked delay line 28 and as a first summand input signal to a two-input digital adder 29. The clocked delay line 28 supplies a response to its input signal after a delay equal to twelve symbol epochs, which delayed response is applied to the digital adder 29 as its second summand input signal. The clocked delay line 28 and the digital adder 29 cooperate to provide an NTSC-rejection filter 30 for suppressing co-channel interference from NTSC signals. The NTSC-rejection filter 30, which is a comb filter, is required as long as NTSC signals are being transmitted over the same channel allocations as digital HDTV signals. The filter 30 suppresses the NTSC luminance carrier and its lower-frequency sidebands containing synchronizing information, very strongly rejects the color subcarrier, suppresses the chrominance sidebands, and suppresses the FM audio carrier. The filter 30 supplies a fifteen-coding-level signal to an equalizer 31 in response to the eight-coding-level digital in-phase synchronous detection result from the detector 23. Though not explicitly shown the input signal to the equalization filter 31 is decimated 2:1 to reduce sample rate to symbol rate. The equalization filter response is supplied from the equalizer 31 as input signal to a trellis decoder 32, which performs the symbol decoding that recovers the digital data stream. The equalizer 31 provides equalization filtering that generates an adjusted amplitude response to the plural-level coding as applied to the trellis decoder 32, which adjusted amplitude response minimizes symbol error resulting from inter-symbol interference.

Although not explicitly shown in FIG. 1, preferably circuitry is provided in the VSB signal receiver 5 to sense when there is co-channel interference from NTSC signal, to by-pass the filter 30 when no co-channel interference from NTSC signal is sensed, and to adjust symbol decoding ranges in accordance with the number of coding levels to be expected. There is less likelihood of the occurrence of erroneous decisions as to symbol identity when eight coding levels have to be discerned than when fifteen coding levels have to be discerned. Although data synchronization circuitry is not explicitly shown in FIG. 1, one skilled in the digital HDTV art will understand that the VSB signal receiver 5 includes circuitry for determining when data fields and data lines occur to provide the basis for timing data de-interleaving. Data field synchronization circuitry takes its input signal from the output port of the equalizer 31, supposing the equalizer 31 is of the type preferred by the inventors, which type makes feedback adjustments of amplitude response dependent on the response of the equalizer 31 to a ghost-cancellation reference signal. The beginning of data fields are signalled by a pseudo-random pulse train that serves as a ghost-cancellation reference signal for the equalizer 31. Data line synchronization circuitry that detects the occurrences of the symbol code sequence signalling the beginning of data lines as they occur in the equalizer 31 response, rather than as they occur in the equalizer 31 input signal, is preferred by the inventors. Such data line synchronization circuitry can use the same circuitry for deciding coding levels as the trellis decoder 32 uses for symbol decoding.

The data response of the trellis decoder 32 is supplied as input signal to a data de-interleaver 33, and the de-interleaved data are supplied from the data de-interleaver 33 to a Reed-Solomon decoder 34. Error-corrected data are supplied from the Reed-Solomon decoder 34 to a data de-randomizer 35 which regenerates packets of data for a packet sorter 36. The packet sorter 36 sorts packets of data for different applications, responsive to header codes in the successive packets of data. Packets of data descriptive of the audio portions of the HDTV program are applied by the packet sorter 36 to a digital sound decoder 37. The digital sound decoder 37 supplies left-channel and right-channel stereophonic sound signals to a plural-channel audio amplifier 38 that drives the plurality of loudspeakers 8, 9. Packets of data descriptive of the video portions of the HDTV program are applied by the packet sorter 36 to an MPEG decoder 39. The MPEG decoder 39 supplies horizontal (H) and vertical (V) synchronizing signals to kinescope deflection circuitry 40 that provides for the raster scanning of the viewing screen of the kinescope 7 or other display device. The MPEG decoder 39 also supplies signals to the kinescope driver amplifiers 41 for applying amplified red (R), green (G) and blue (B) drive signals to the kinescope 7 or other display device.

The invention concerns the specific nature of the digital circuitry 2 for synchrodyning to baseband. Various embodiments of this circuitry, which use finite-impulse-response digital filters designed based on Jacobian elliptic functions as described by C. M. Rader, are shown in FIGS. 2, 3, 4 and 5. The $H_1(z)$ and $H_2(z)$ system functions these FIR digital filters provide are all-pass, and the phase response of the $H_1(z)$ system function leads the phase response of the $H_2(z)$ system function by $\pi/2$ radians across the final intermediate-frequency band.

Figure 2:
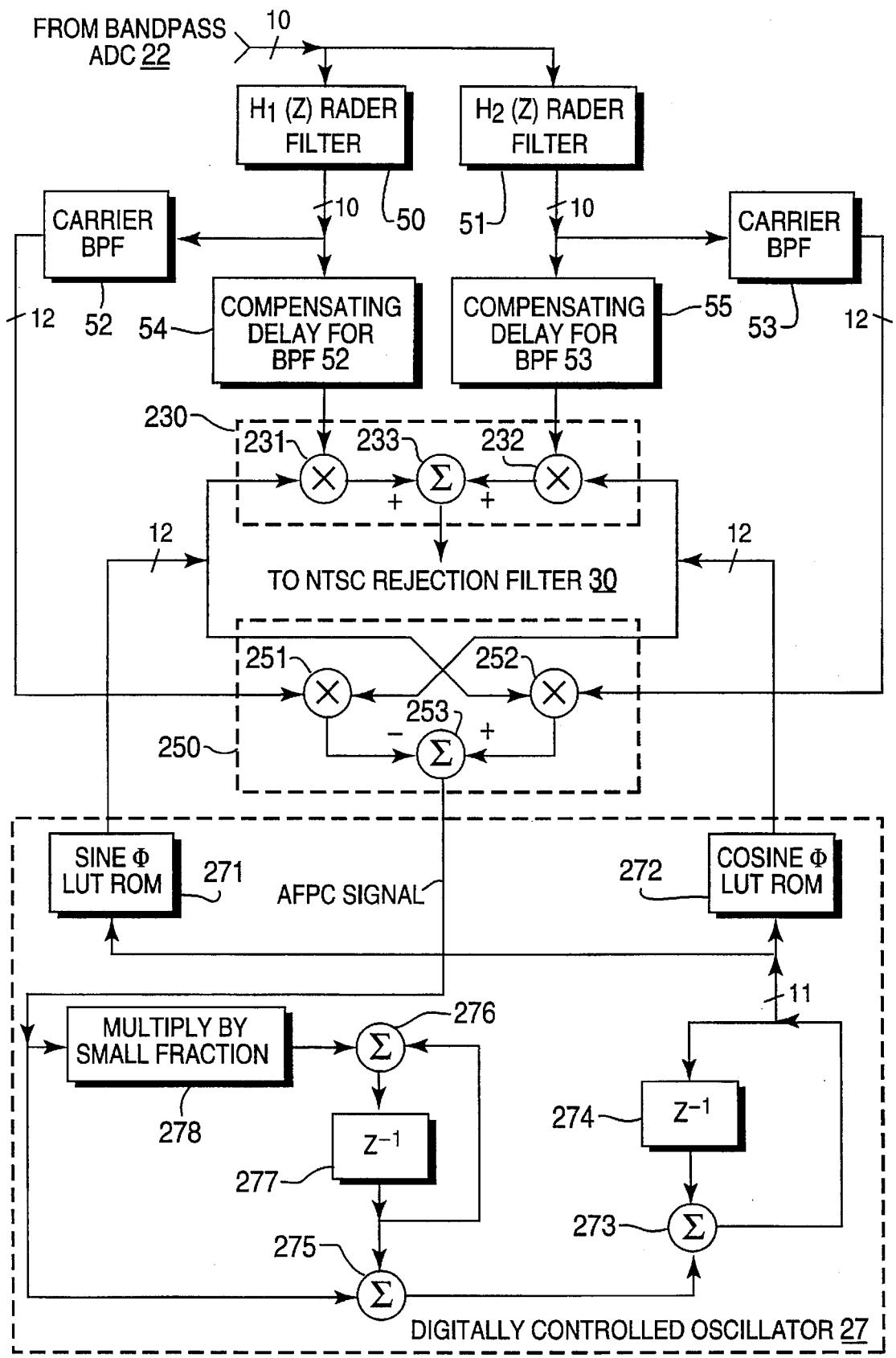
FIGS. 2, 3, 4, and 5 are block schematic diagrams of different configurations that the digital circuitry for synchrodyning symbols to baseband takes in the FIG. 1 VSB receiver in various specific embodiments of the invention.

FIG. 2 shows digital circuitry for synchrodyning VSB signals to baseband in which the digitized final IF signal from the analog-to-digital converter 22 is supplied as input signal to FIR digital filters 50 and 51 of the type described by C. M. Rader, which respectively provide the $H_1(z)$ and $H_2(z)$ system functions. The responses of the digital filters 50 and 51 are supplied as input signals to carrier bandpass filters 52 and 53, respectively. The filters 52 and 53, which have identical bandpass characteristics, separate the complex pilot carrier wave from the sidebands of the carrier wave modulated in accordance with the 8-level VSB coding in the complex signal formed by the responses of the digital filters 50 and 51. The responses of the digital filters 50 and 51 are supplied as input signals to digital delay lines 54 and 55, which provide respective compensating delays equal to the latency times of carrier bandpass filters 52 and 53, respectively.

An in-phase synchronous detector 230 for the complex signal supplied from the digital delay lines 54 and 55 comprises digital multipliers 231 and 232 for multiplying the responses supplied from the delay lines 54 and 55 by the sine and the cosine of the carrier wave, respectively, and a digital adder 233 for summing the product signals from the digital multipliers 231 and 232. Since it is known in advance that the imaginary term of the complex product will invariably be zero-valued, or substantially so, the digital multipliers and subtractor that would be required to generate the imaginary term are dispensed with. The in-phase synchronous detector 230 output signal, which is supplied as the sum signal from the adder 233, is applied to the NTSC-rejection filter 26 as its input signal.

A quadrature-phase synchronous detector 250 includes comprises digital multipliers 251 and 252 for multiplying the responses of the carrier bandpass filters 52 and 53 by the cosine and the sine of the carrier wave, respectively, and a digital subtractor 253 for subtracting the product signal of the digital multiplier 251 from the product signal of the digital multiplier 252. That is, the complex digital description of separated pilot carrier wave furnished by the carrier bandpass filters 52 and 53 is multiplied by the complex digital description of the quadrature-phase carrier wave. Since it is known in advance that the real term of the complex product will invariably be zero-valued, or substantially so, the digital multipliers and adder that would be required to generate the real term are dispensed with. The difference output signal from the subtractor 253 provides an AFPC signal to the DCO 27.

The digital controlled oscillator 27 shown in FIG. 2 comprises a carrier wave sine $\Phi$ look-up table in read-only memory 271 for supplying 12-bit multiplicands to the digital multipliers 231 and 252, a carrier wave cosine $\Phi$ look-up table in read-only memory 272 for supplying 12-bit multiplicands to the digital multipliers 232 and 251, and a ROM address generator for the ROMs 271 and 272. This address generator includes a two-input digital adder 273 supplying the ROM addresses to the ROMs 271 and 272 as its sum output signal and a clocked one-sample delay element 274 for applying that sum output signal to a first summand input of the adder 273 to complete an accumulator for the ROM addresses. A two-input digital adder 275 supplies its sum output signal to the second summand input of the adder 273 for incrementing the ROM address accumulation each system clock cycle. The plural-conversion tuner I preferably heterodynes the carrier of the VSB signal to the lower-frequency portion of the band of final IF signal frequencies supplied to the ADC 22, rather than the higher-frequency portion of that band, because the sine $\Phi$ and cosine $\Phi$ muitiplicands are then supplied from the ROMs 271 and 272 with a greater number of samples per $2\pi$ radians of $\Phi$, which provides higher angular resolution in the consecutive carrier wave samples.

In the absence of error in the oscillations of the DCO 27, as supplied in quadrature-related phasings from the ROMs 271 and 272, the sum output signal from the subtractor 253 that is supplied as AFPC error signal will be zero-valued. The sum output signal from the subtractor 253 is supplied to a first summand input of the adder 275, but being zero-valued will have no effect on the sum output signal from the adder 275. The sum output signal from the adder 275 will be the same as the signal supplied to its second summand input, which is the sum output signal from another digital adder 276 as delayed by one sample by a clocked one-sample delay element 277. The sum output signal from the subtractor 253 is supplied to a digital multiplier 278 as multiplier input signal to multiply a fixed multiplicand, which multiplier input signal being zero causes the product output signal from the digital multiplier 278 to be zero-valued as well. The product output signal from the digital multiplier 278 is supplied to a first summand input of the adder 276, but being zero-valued will have no effect on the sum output signal from the adder 276. The sum output signal from the adder 276 will be the same as the signal supplied to its second summand input, which is the previous-sample value of the sum output signal from the adder 276 as delayed one sample by the clocked one-sample delay element 277. The loop connection of the adder 276 and the clocked one-sample delay element 277 form a circulating-delay-line memory that continues to supply the same increment to the second summand input of the adder 275 and thence to the second summand input of the adder 273, system clock cycle after system clock cycle, as long as the AFPC signal from the sum output of the adder 253 remains zero-valued. The ROM addresses from the sum output of the adder 273 will continuously ramp up in value until overflow occurs to restart the cycle of continuously ramping up those ROM addresses.

When the AFPC signal from the sum output of the adder 253 is positive in value, this is indicative that the oscillations of the DCO 27, as supplied in quadrature-related phasings from the ROMs 271 and 272, are retarded in phase from proper value. The positive AFPC signal is applied to the first summand input of the adder 275, causing its sum output signal to be increased in value from its value when the AFPC signal is zero-valued. This immediately advances, or sets ahead, the point from which the ROM addresses supplied from the sum output of adder 273 ramp up, which ramping up continues to occur owing to the addresses being fed back to the first summand input of the adder 273 through the single-sample delay element 274. The positive AFPC signal is applied as multiplier input signal to the digital multiplier 278 to multiply the fixed multiplicand, which fixed multiplicand is a small fraction, so a small positive product output signal is generated by the digital multiplier 278 for application to the first summand input of the adder 276. This first summand input signal of small value increases the sum output signal from the adder 276, increasing the size of the increment that is stored in the circulating-delay-line memory formed by the loop connection of the adder 276 and the clocked one-sample delay element 277. This larger increment is applied by the clocked one-sample delay element 277 after one sample delay to the second summand input of the adder 275 and thence to the second summand input of the adder 273. This increased increment speeds the rate of address accumulation single-sample delay element single-sample delay element 274 feeding back the sum output signal of that adder to its first summand input. The ROM addresses from the sum output of the adder 273 will continuously ramp up in value until overflow occurs to restart the cycle of continuously ramping up those ROM addresses, the ramping up occurring at the increased rate of accumulation until further non-zero value of the AFPC signal further alters the rate of address accumulation.

When the AFPC signal from the sum output of the adder 253 is negative in value, this is indicative that the oscillations of the DCO 27, as supplied in quadrature-related phasings from the ROMs 271 and 272, are advanced in phase from proper value. The negative AFPC signal is applied to the first summand input of the adder 275, causing its sum output signal to be increased in value from its value when the AFPC signal is zero-valued. This immediately retards, or sets back, the point from which the ROM addresses supplied from the sum output of adder 273 ramp up, which ramping up continues to occur owing to the addresses being fed back to the first summand input of the adder 273 through the single-sample delay element 274. The negative AFPC signal is applied as multiplier input signal to the digital multiplier 278 to multiply the fixed multiplicand, which fixed multiplicand is a small fraction, so a small negative product output signal is generated by the digital multiplier 278 for application to the first summand input of the adder 276. This first summand input signal of small value decreases the sum output signal from the adder 276, decreasing the size of the increment that is stored in the circulating-delay-line memory formed by the loop connection of the adder 276 and the clocked one-sample delay element 277. This smaller increment is applied by the clocked one-sample delay element 277 after one sample delay to the second summand input of the adder 275 and thence to the second summand input of the adder 273. This decreased increment slows the rate of address accumulation by the adder 273 and the single-sample delay element 274 feeding back the sum output signal of that adder to its first summand input. The ROM addresses from the sum output of the adder 273 will continuously ramp up in value until overflow occurs to restart the cycle of continuously ramping up those ROM addresses, the ramping up occurring at the decreased rate of accumulation until further non-zero value of the AFPC signal further alters the rate of address accumulation.

Figure 3:
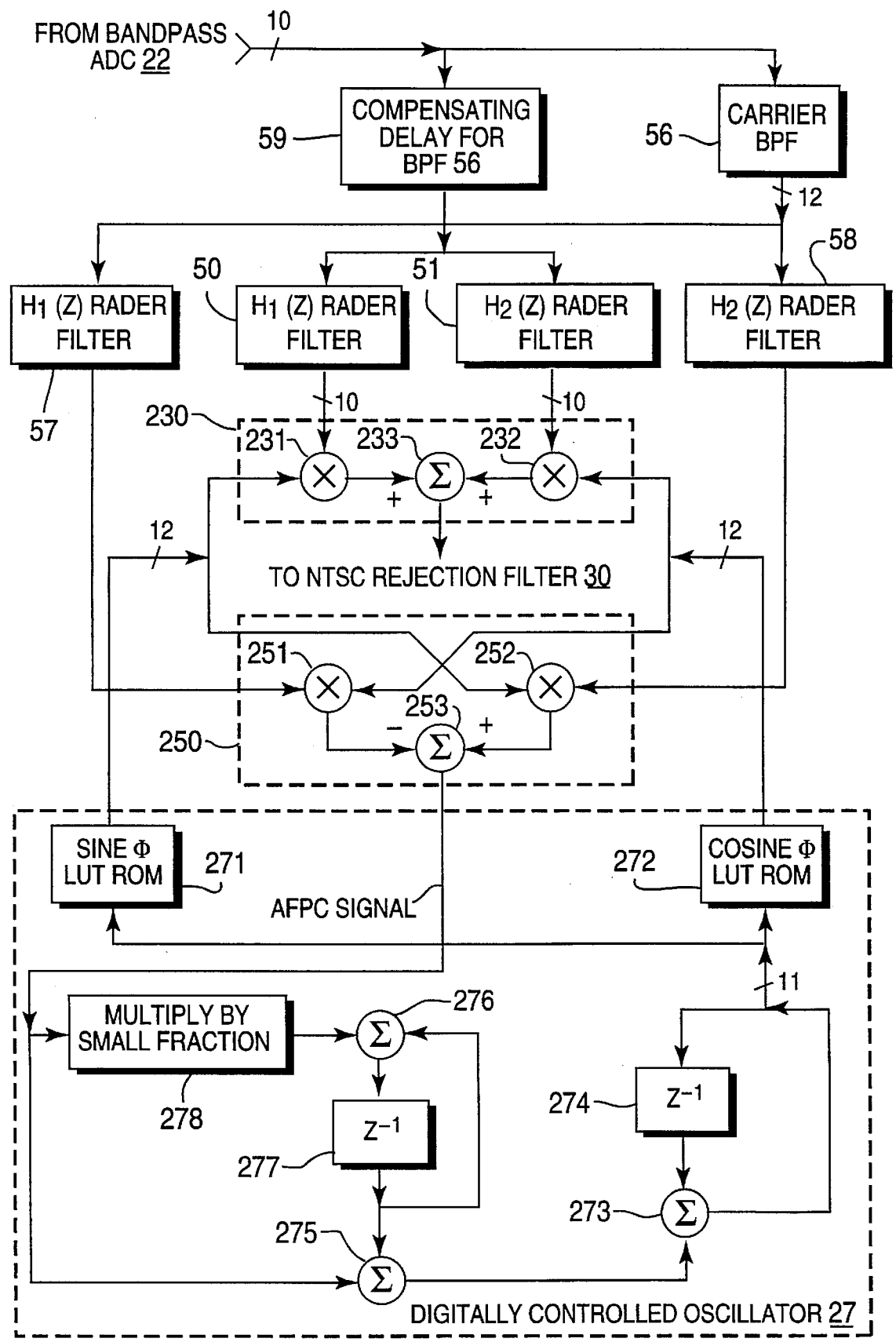

FIG. 3 shows digital circuitry for synchrodyning VSB signals to baseband in another embodiment of the invention, which differs from the FIG. 2 circuitry in the following respects. The narrowband carrier bandpass filters 52 and 53 are dispensed with, in favor of a single narrowband carrier bandpass filter 56 receiving the digitized final IF signal from the ADC 22 as its input signal and selecting a digitized carrier wave therefrom for its response. The filter 56 response is supplied as input signal to an FIR digital filter 57 of the type described by C. M. Rader for providing the $H_1(z)$ system function, for convolution with the filter 56 response. The filter 56 response is also supplied as input signal to an FIR digital filter 58, of the type described by C. M. Rader for providing the $H_2(z)$ system function, for convolution with the filter 56 response. The connections to the quadrature-phase synchronous detector 250 are altered so that the digital multipliers 251 and 252 multiply the responses of the digital filters 57 and 58, respectively, rather than the responses of the carrier bandpass filters 52 and 53.

A delayed response to the digitized final IF signal from ADC 22, which delayed response is supplied by a digital delay line 59, is applied as input signal to the FIR digital filters 50 and 51. The responses of the FIR digital filters 50 and 51 are applied directly to the digital multiplier 231 and to the digital multiplier 232 as their respective multiplicand signals. The digital delay line 59 provides compensating delay for the latency of the carrier bandpass filter 56 in the responses of both the filters 50 and 51. The single delay line 59 in cascade connection before the filters 50 and 51 provides the same responses as the two delay lines 54 and 55 connected in respective cascade connections after the filters 50 and 51 do in FIG. 2.

Figure 4:
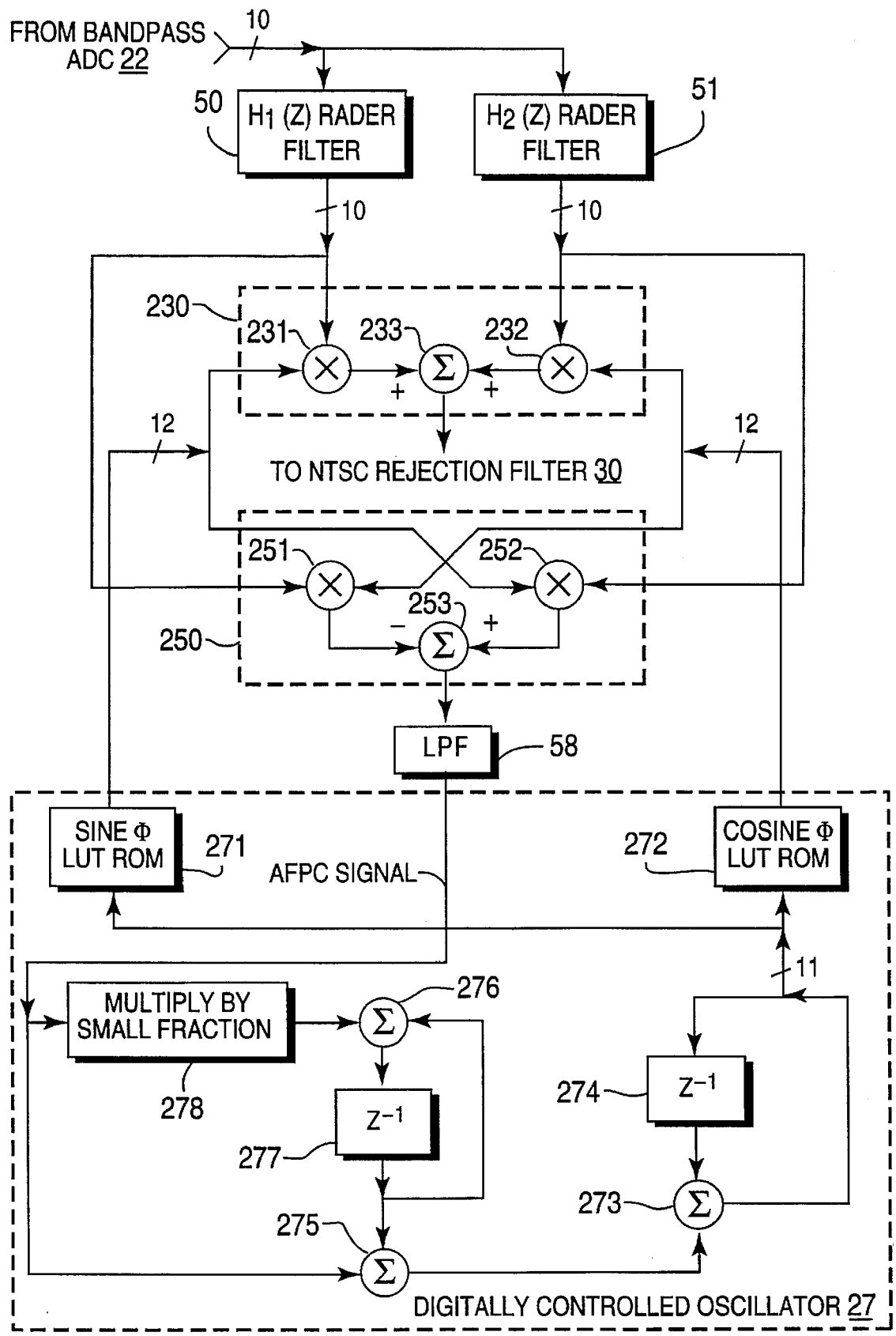

FIG. 4 shows still other digital circuitry for synchrodyning VSB signals to baseband in another embodiment of the invention, which differs from the FIG. 2 circuitry in the following respects. The carrier bandpass filters 52 and 53 are each replaced by a respective wired connection. The digital delay lines 54 and 55, which provide respective compensating delays equal to the latency times of carrier bandpass filters 52 and 53 in FIG. 2, are each replaced by a respective wired connection. The quadrature-phase synchronous detector 250 is operated relatively wideband, with the AFPC signal attributable to the carrier wave being heterodyned to zero or close-to-zero frequency being selected from the sum output signal of the adder 253 using a low-pass digital filter 58. The low-pass filter 58 is chosen to have a cut-off frequency many times lower than symbol rate, so that frequencies associated with groups of successive similar symbols are rejected. The randomization of data as a preliminary step before symbol coding at the transmitter limits the number of successive similar symbols likely to occur, which facilitates lowpass filtering after quadrature-phase synchronous detection to recover AFPC signal. The randomization of data also facilitates bandpass filtering before quadrature-phase synchronous detection to recover AFPC signal per FIG. 2 or 3.

A straightforward variant of the DCO 27 shown in FIGS. 2, 3, and 4 is a DCO in which the two-input adders 273 and 275 are replaced by a single three-input digital adder. A number of tricks relying on symmetries in the sine and cosine functions are known to skilled digital designers for reducing the amount of ROM required for sine $\Phi$ and cosine $\Phi$ table look-up, and the DCO 27 can be modified to use such reduced-ROM designs. Arrangements where the sine $\Phi$ and cosine $\Phi$ signals are not read from ROM, but rather are accumulated in parallel in accordance with the sin (A+B)= sin A cos B+cos A sin B and cos (A+B)=cos A cos B−sin A sin B trigonometric formulae are another DCO arrangement that can be used in modifications of the DCO 27 in further embodiments of the invention.

Figure 5:
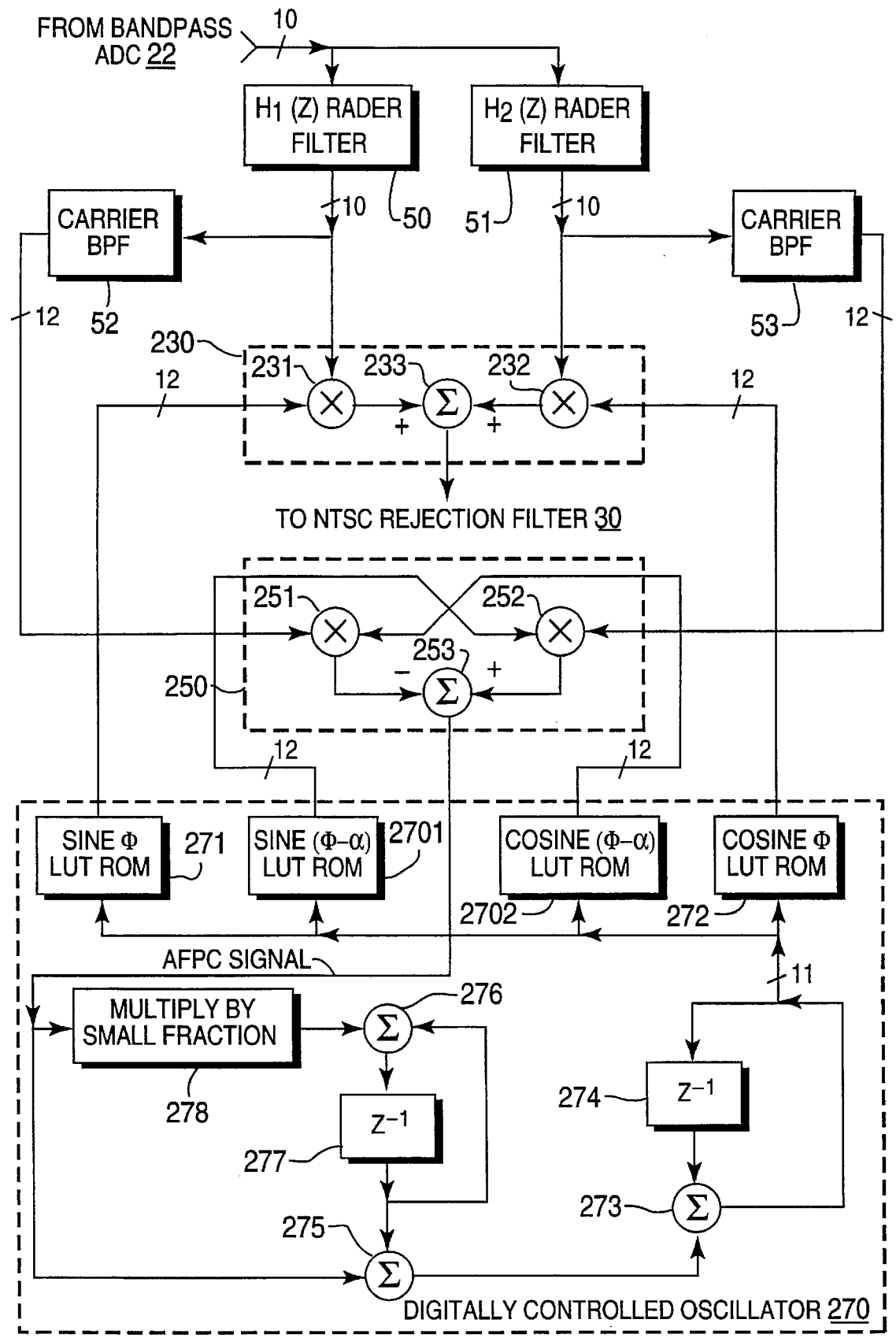

FIG. 5 shows a variant of the digital circuitry for synchrodyning VSB signals to baseband shown in FIGS. 2 and 3, which variant uses a DCO 270 that differs from the DCO 27 in that it further includes a read-only memory 2701 storing a sin ($\Phi-\alpha$) look-up table and a read-only memory 2702 storing a cos ($\Phi-\alpha$) look-up table. The digital multiplier 252 receives its multiplier signal from the ROM 2701, rather than from the ROM 271; and the digital multiplier 251 receives its multiplier signal from the ROM 2702, rather than from the ROM 272. The digitized final IF signal from the ADC 22 is applied, via a wired connection without substantial delay, as input signal to the filter 50; and the response of the filter 50 is applied, via wired connection without substantial delay, to the digital multiplier 231 as its multiplicand input signal. The digitized final IF signal from the ADC 22 is applied, via a wired connection without substantial delay, as input signal to the filter 51; and the response of the filter 51 is applied, via a wired connection without substantial delay, to the digital multiplier 231 as its multiplicand input signal. In special cases where α is 90°, the ROMs 2701 and 2702 are not required, of course, since the cos (Φ–α) and sin (Φ–α) values are respectively the sin Φ value as read from the ROM 271 and the negative of the cos Φ value as read from the ROM 272.

Although the radio receivers specifically described above for receiving VSB signals including symbol codes descriptive of digital signals use the triple-conversion tuner 1 for developing a third intermediate-frequency signal, as the final intermediate-frequency signal which is subjected to complex synchronous detection, receivers using double-conversion tuners and a bandpass phase tracker of a nature as described above embody the invention in its broader aspects. Radio receivers using only a double-conversion tuner are possible, in which the second intermediate-frequency signal is the final intermediate-frequency signal and is in the same frequency range as the final intermediate-frequency signal of the triple-conversion tuner 1. It is also possible to construct a double-conversion tuner that converts the selected HDTV channel directly to the 30–45 MHz range and then converts the resulting first immediate frequency signal to a final intermediate frequency in the 1–8 MHz range. An AGC range of 60–90 dB is required of the tuner, requiring a plurality of controlled-gain intermediate-frequency amplifier stages. Maintaining phase linearity over a wide range of controlled gain is more easily achieved at frequencies higher than the 1–8 MHz range. So, when the final IF signal is chosen to be in the 1–8 MHz range, it is preferable that the IF amplifiers before the final mixer provide the required AGC range of 60–90 dB. Providing this controlled gain at two frequencies better avoids unwanted regeneration effects, which tend to occur in a high-gain amplifier operating in a single frequency band. The high degree of phase-linearity required of the SAW filtering is easier to achieve at intermediate frequencies higher than the 30–40MHz range. Accordingly, a triple-conversion tuner is currently preferred.

Figure 6:
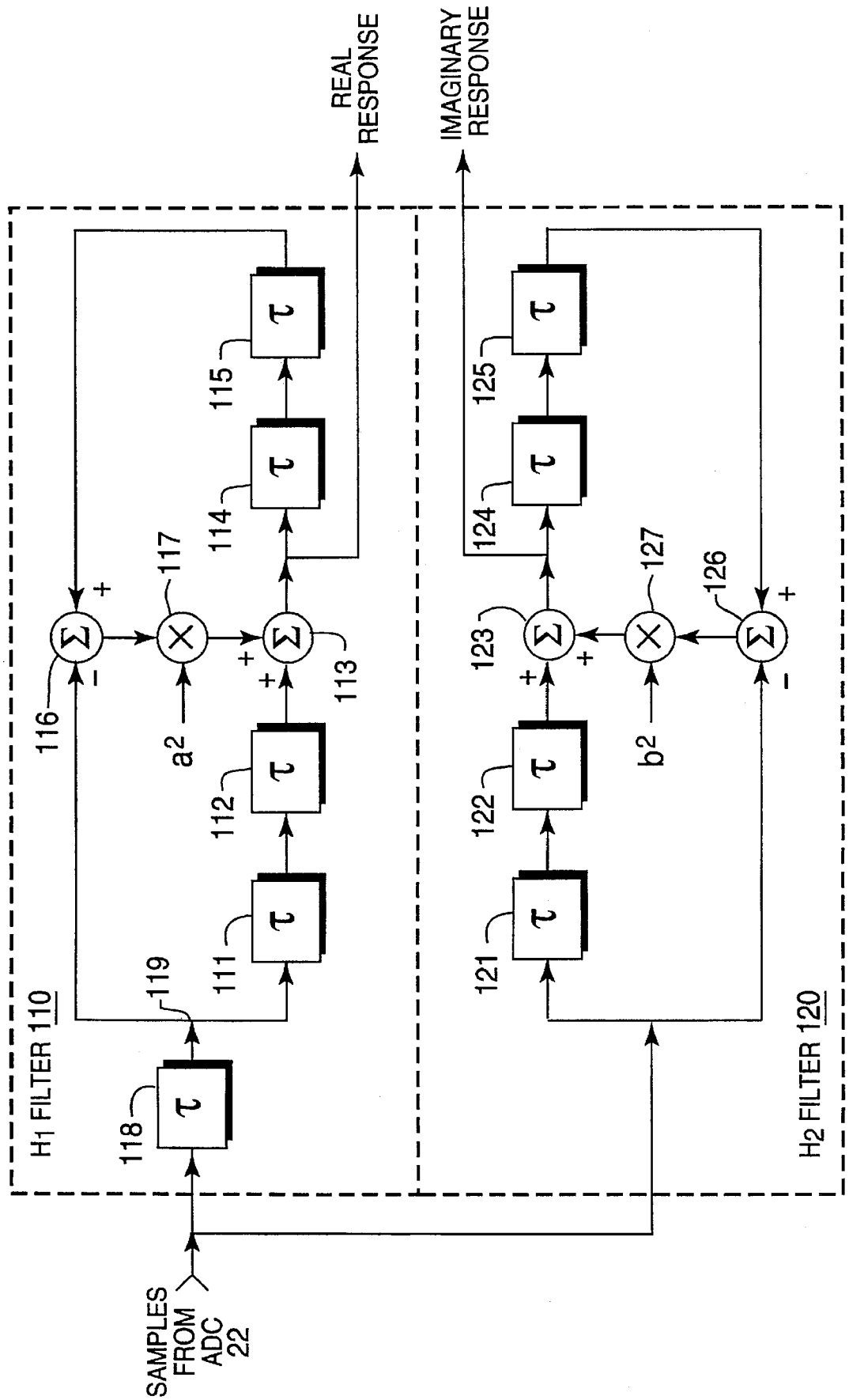
FIG. 6 is a detailed block schematic diagram of a pair of all-pass digital filters designed based on Jacobian elliptic functions and exhibiting a constant $\pi/2$ difference in phase response for the digitized bandpass signals, as can be employed in the synchronous detection circuitry of FIGS. 2, 3, 4 or 5.

FIG. 6 is a detailed block schematic diagram of a complex-signal filter. The FIG. 6 filter includes a pair of all-pass digital filters 110 and 120 designed based on Jacobjan elliptic functions and exhibiting a constant π/2 difference in phase response for the digitized bandpass signals, as described by C. M. Rader. The filters 50 and 51 of FIG. 2, 3, 4 or 5 can be constructed like filters 110 and 120. So can the filters 57 and 58 of FIG. 3. Since oversampled real samples better provide for the proper functioning of the mean-square-error gradient detection filter 90 in the symbol synchronizer 3, the inventors prefer not to use, in their digital circuitry for synchrodyning VSB signals, the all-pass filters described by Rader that exploit sub-sampling to provide further reductions in the delay network circuitry. Further, oversampled imaginary samples facilitate a closer phase lock of the DCO 27 or 270.

The construction of the filter 110, which provides the system function $H_1(z)=z^{-1}(z^{-2}-a^1)/(1-a^2z^{-2})$, where $a^2=0.5846832$ in decimal arithmetic, is shown in FIG. 6 to be as follows. The samples from the ADC 22 are delayed by one ADC sample clock duration in a clocked delay element 118 for application to a node 119. The signal at node 119 is further delayed by two ADC sample clock durations in cascaded clocked delay elements 111 and 112, for application as its first summand signal to a digital adder 113. The sum output signal of the adder 113 provides the real response from the filter 110. The sum output signal of the adder 113 is delayed by two ADC sample clock durations in cascaded clocked delay elements 114 and 115, for application as minuend input signal to a digital subtractor 116 that receives the signal at node 119 as its subtrahend input signal. The resulting difference output signal from the digital subtractor 116 is supplied as multiplier input signal to a digital multiplier 117 for multiplying an $a^2$ multiplicand signal, using a binary arithmetic. The resulting product output signal is applied to the digital adder 113 as its second summand signal.

The construction of the filter 120, which provides the system function $H_2(z)=-(z^{-2}b^2)/(1-b^2z^{-2})$, where $b^2=0.1380250$ in decimal arithmetic, is shown in FIG. 6 to be as follows. The samples from the ADC 22 are delayed by two ADC sample clock durations in cascaded clocked delay elements 121 and 122, for application as its first summand signal to a digital adder 123. The sum output signal of the adder 123 provides the imaginary response from the filter 120. The sum output signal of the adder 123 is delayed by two ADC sample clock durations in cascaded clocked delay elements 124 and 125, for application to a digital adder 126 as its second summand signal that receives the samples from the ADC 22 as its subtrahend input signal. The resulting sum output signal from the digital adder 126 is supplied as multiplier input signal to a digital multiplier 127 for multiplying a $b^2$ multiplicand signal, using a binary arithmetic. The resulting product output signal is applied to the digital adder 123 as its second summand signal.

Figure 7:
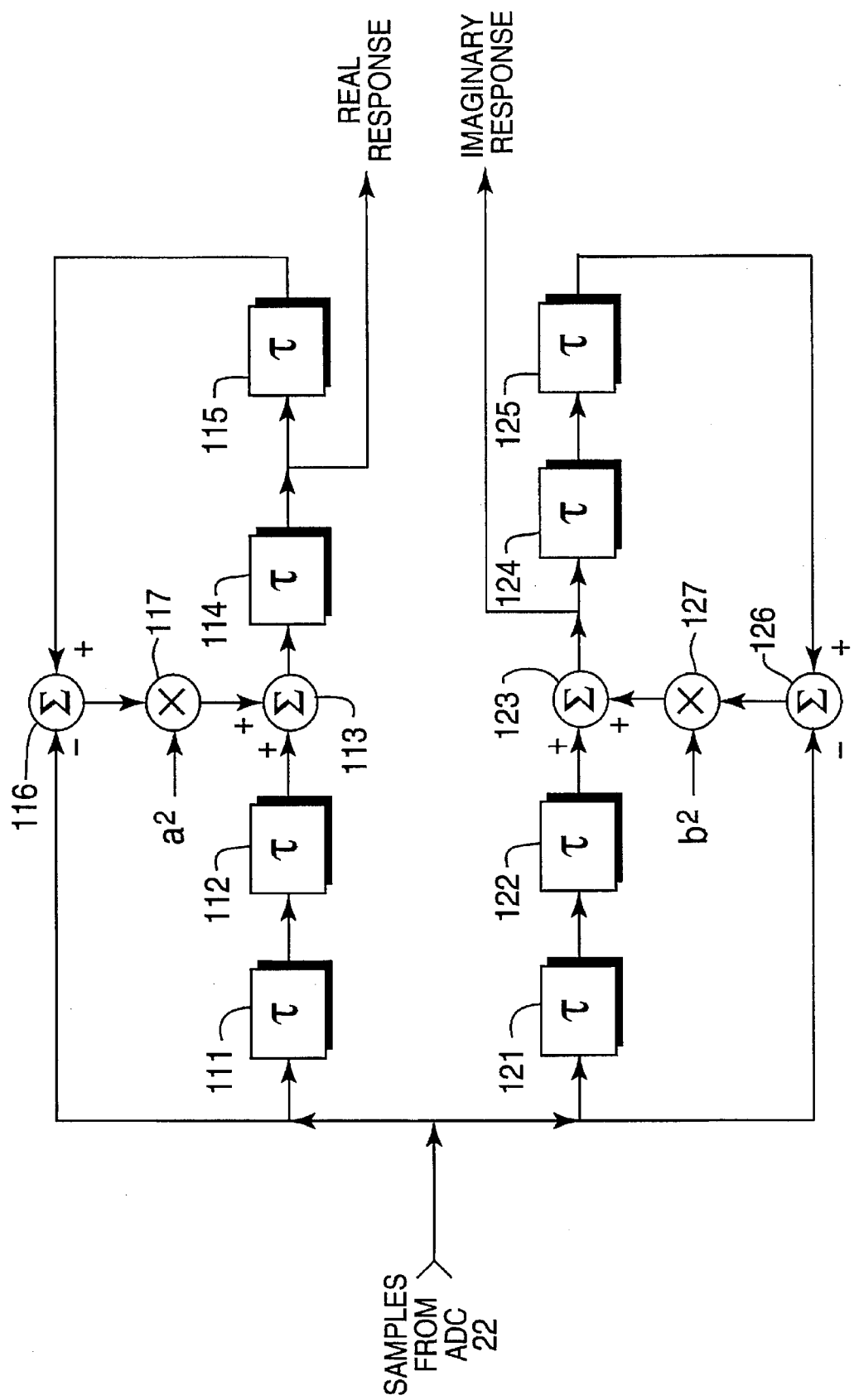
FIGS. 7 and 8 are block schematic diagrams of changes that can be made the filter circuitry of FIG. 6 to remove redundant delay.

FIG. 7 shows a complex-signal filter resulting from modifying the FIG. 6 complex-signal filter as follows. The position of the clocked delay element 118 is shifted so as to delay the sum output signal of the adder 113, rather than to delay the digital output signal of the ADC 22, and the digital output signal of the ADC 22 is applied to the node 119 without delay, thereby to cause real response to be provided at the output port of the shifted-in-position clocked delay element 118. The real response provided at the output port of the shifted- in-position clocked delay element 111 is the same as the response provided at the output port of the clocked delay element 114. So, the real response is provided from the output port of the clocked delay element 114 instead of from the output port of the shifted-in-position clocked delay element 111; and the shifted-in-position clocked delay element 111, being no longer required, is dispensed with.

Figure 8:
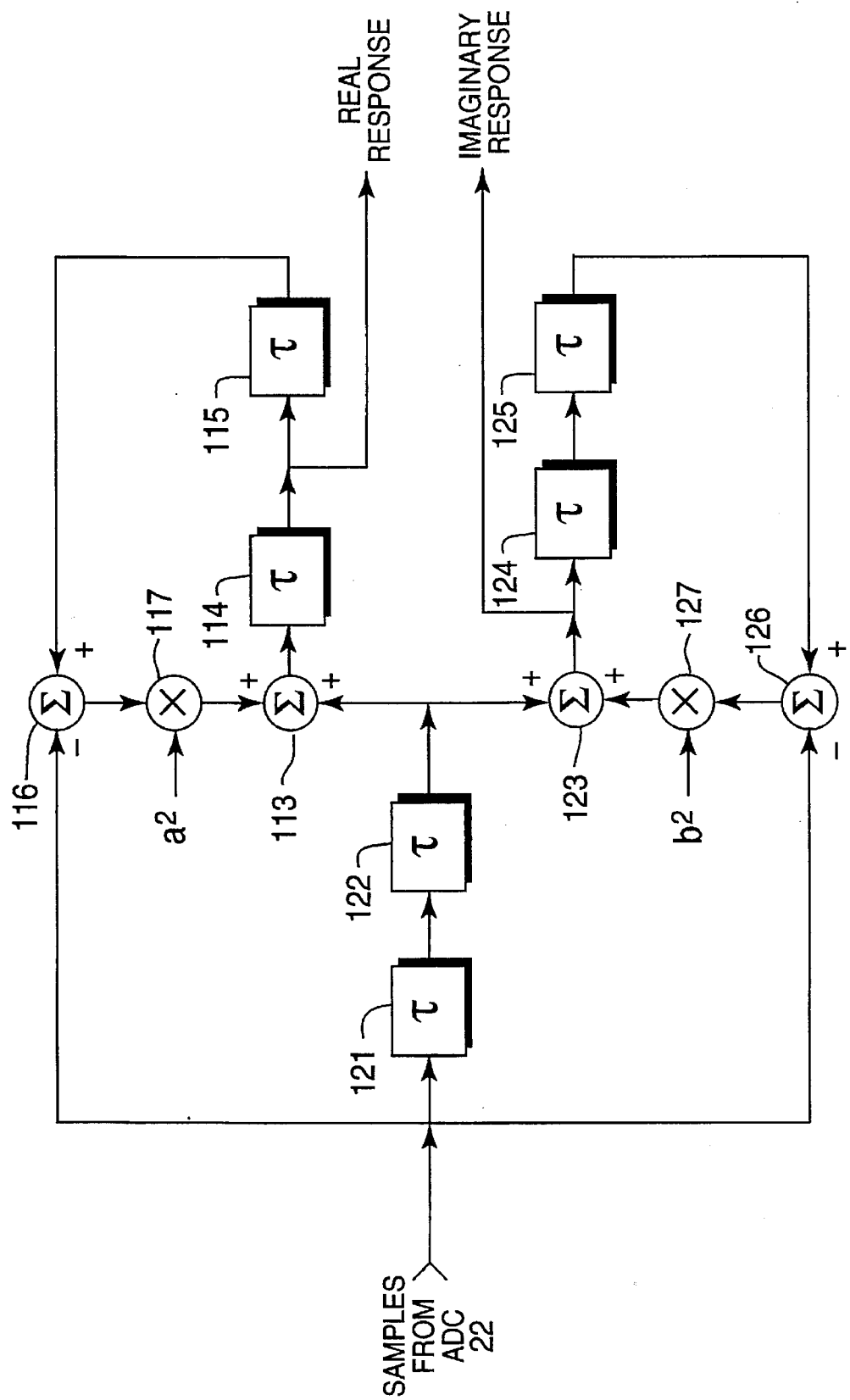

FIG. 8 shows a complex-signal filter resulting from modifying the FIG. 7 complex-signal filter as follows. The first summand signal for the adder 113 is then taken from the cascaded clocked delay elements 121 and 122, rather than from the cascaded clocked delay elements 111 and 112. The cascaded clocked delay elements 111 and 112, being no longer required, are dispensed with. The FIG. 8 complex-signal filter is preferred over the complex-signal filters of FIG. 6 and 7 in that redundant clocked delay elements are eliminated.

Figure 9:
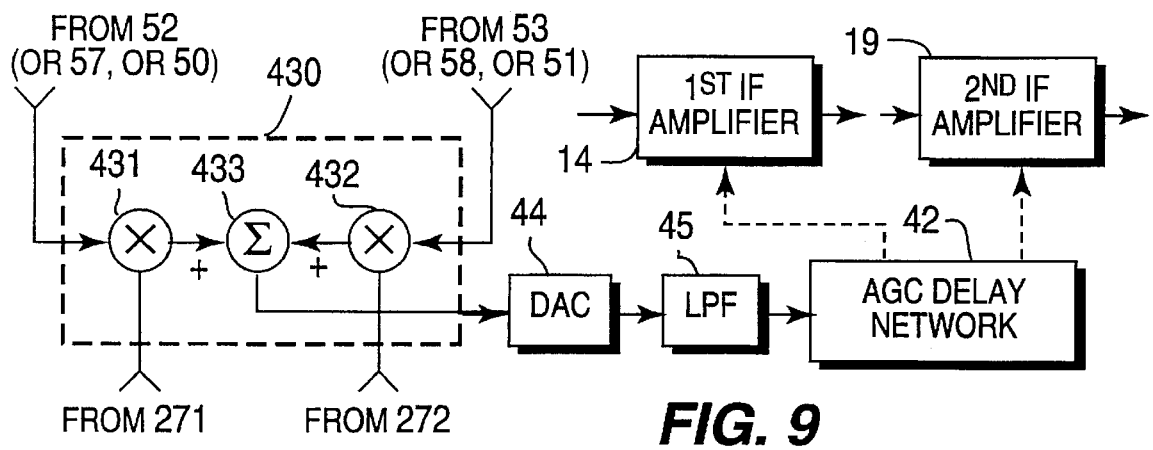
FIG. 9 is a block schematic diagram of an automatic gain control (AGC) arrangement for the FIG. 1 VSB signal receiver, as constructed to use digital circuitry for synchrodyning VSB signals to baseband per FIGS. 2, 3, 4 or 5.

FIG. 9 shows an arrangement for supplying automatic gain control (AGC) signal to an AGC delay network 42 that supplies gain-control signals to the first IF amplifier 14 and the second IF amplifier 19 of the FIG. 1 VSB signal receiver for controlling their respective gains. The combined operation of the first IF amplifier 14, the second IF amplifier 19 and the AGC delay network 42 is accordance with prior-art practice. What is of particular interest is the way in which the AGC input signal is generated for application to the AGC delay network 42. The FIG. 9 arrangement for supplying AGC signal to the AGC delay network 42 includes another in-phase synchronous detector 430 which comprises: a digital multiplier 431 for multiplying by the sine of the carrier wave the same signal the digital multiplier 251 multiplies by the cosine of the carrier wave, a digital multiplier 432 for multiplying by the cosine of the carrier wave the same signal the digital multiplier 252 multiplies by the sine of the carrier wave, and a digital adder 433 for summing the product signals from the digital multipliers 431 and 432. The digital output signal of the in-phase synchronous detector 430 is converted to an analog signal by the digital-to-analog converter (DAC) 44, and the analog output signal of the DAC 44 is lowpass filtered by a lowpass filter 45 to generate the AGC input signal applied to the AGC delay network 42. The AGC delay network 42 may include an AGC signal amplifier for the AGC input signal, but with carefully design the need for such AGC signal amplifier can be avoided.

Figure 10:
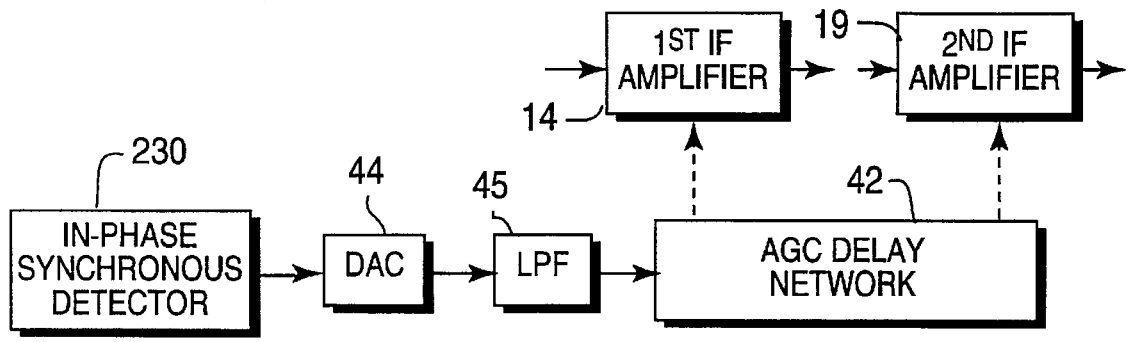
FIG. 10 is a block schematic diagram of still another AGC arrangement for the FIG. 1 VSB signal receiver, as constructed to use digital circuitry for synchrodyning VSB signals to baseband per FIGS. 2, 3, 4 or 5.

FIG. 10 shows an alternative arrangement for supplying AGC signal to the AGC delay network 42 included in the FIG. 1 VSB signal receiver. The DAC 44 is supplied the response of the in-phase synchronous detector 230 of FIG. 2, 3, 4 or 5.

Figure 11:
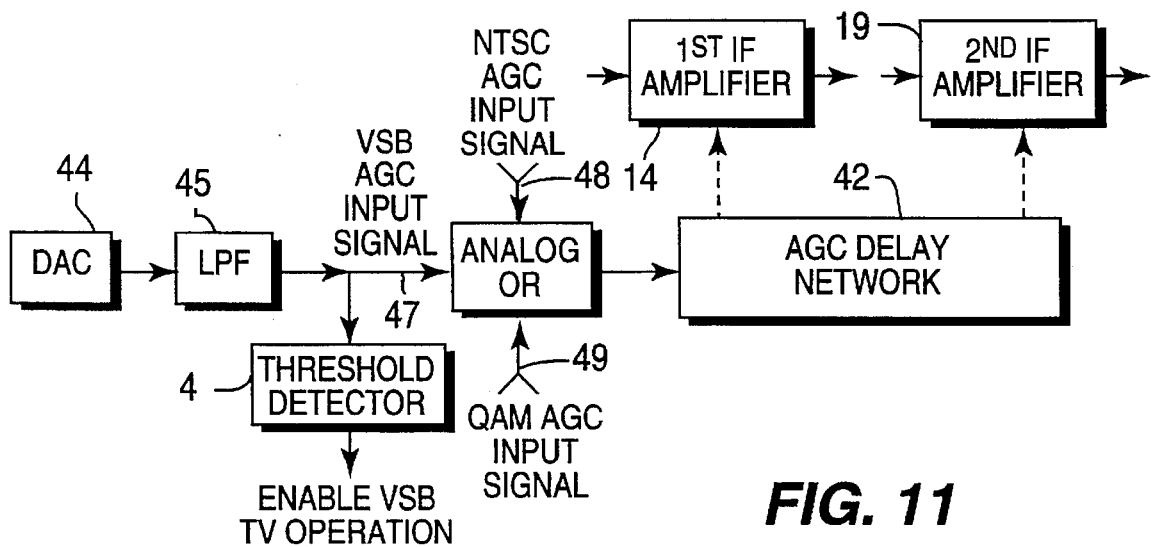
FIG. 11 is a block schematic diagram of a modification that can be made to either of the AGC arrangements of FIGS. 8 or 9 in a television receiver adapted for receiving at least one other type of television signal in addition to the type using a VSB signal encoding digital information in symbol form.

FIG. 11 shows a variation in the way that the response of the lowpass filter 45 is applied to the AGC delay network 42 in a television receiver using the second IF amplifier response as input signal to additional receiver circuitry for NTSC television signals, or as input signal to additional receiver circuitry for HDTV signals on a complex-amplitude-modulation (QAM) carrier, or as input signals to both those types of additional receiver circuitry, besides being used in additional receiver circuitry for VSB HDTV signals. The response of the lowpass filter 45 is applied to a first input 47 an analog OR circuit 46, which receives at least one other input signal. A second input 48 of the analog OR circuit 46 can be supplied AGC input signal either from additional receiver circuitry for NTSC television signals or from additional receiver circuitry for HDTV signals on a complex-amplitude-modulation (QAM) carrier. Alternatively, the second input 48 and a third input 49 of the analog OR circuit 46 can be supplied respective AGC input signals from separate ones of additional receiver circuitry for NTSC television signals and additional receiver circuitry for HDTV signals on a complex-amplitude-modulation (QAM) carrier. The response of the analog OR circuit 46 applied to the AGC delay network 42 as a selected one of the AGC input signals supplied thereto is assumed to respond to the largest of them, as referrred to a reference potential for which no reduction in the gains of the first IF amplifier 14 and the second IF amplifier 19 occurs and to which any unused input of the analog OR circuit 46 is returned. Furthermore, in order for reduction in the gains of the IF amplifiers 14 and 19 to occur, the departure from the reference potential of the selected AGC input signal applied to the AGC delay network 42 must be of substantial value.

A threshold detector 4 responds to the response of the lowpass filter 45 departing from the reference potential in the sense tending to curtail the gains of the IF amplifiers 14 and 19 by more than a threshold value, which threshold value is much smaller than the substantial value at which the gains are actually curtailed, to generate a signal that enables operation of the television receiver for reproducing the television program transmitted on a VSB carrier selected by the tuner 1.

The digital VSB detection circuitry described herein is attractive for use in a television receiver that is designed to have the capability for receiving HDTV signals on a complex-amplitude-modulation (QAM) carrier. The need for additional receiver circuitry to detect the complex-amplitude-modulation (QAM) carrier is reduced since the DCO and fullband in-phase synchronous detector portions of the digital VSB detection circuitry can also be included in the digital QAM detection circuitry.

What is claimed is:

1. A digital television receiver for receiving digital television signals, each having a pilot carrier, having a vestigial sideband below the frequency of its pilot carrier and having a full sideband above the frequency of its pilot carrier, said digital television receiver comprising:

a tuner for selecting one of channels at different locations in a frequency band and frequency converting the selected channel to a final intermediate-frequency signal in a final intermediate-frequency band which has its lowest frequencies above zero frequency, said final intermediate-frequency signal having a vestigial sideband below the frequency of its pilot carrier and having a full sideband above the frequency of its pilot carrier;

an analog-to-digital converter for digitizing said final intermediate-frequency signal to generate as an output signal thereof digitized final intermediate-frequency signal; and digital circuitry for synchrodyning said digitized final intermediate-frequency signal to baseband.

2. A digital television receiver as set forth in claim 1, wherein said digital circuitry for synchrodyning said digitized final intermediate-frequency signal to baseband comprises:

a digitally controlled oscillator for generating a first sample of a controlled frequency and a second sample of said controlled frequency, said controlled frequency being controllable over a range of frequencies including the carrier frequency of said final intermediate-frequency signal in response to a digital control signal indicative of the difference of said controlled frequency from a desired frequency;

digital filter circuitry responsive to said digitized final intermediate-frequency signal for supplying descriptions of said final intermediate-frequency signal;

first and second filters having functions which include the carrier frequency of said final intermediate-frequency signal, said first filter providing a first frequency-selective response to a first portion of the descriptions, said second filter providing a second frequency-selective response to a second portion of the descriptions;

a first detector which inputs said first frequency-selective response, said second frequency-selective response, said first sample, and said second sample and which generates a corresponding difference signal indicative of the departure of the frequency and phase of said controlled frequency from the carrier frequency of said final intermediate-frequency signal;

means responsive to said difference signal for supplying said digital control signal to said digitally controlled oscillator; and a second detector which inputs said first portion and said second portion of said descriptions and said first and second samples and which outputs a corresponding sum signal which is supplied as an output signal from said digital circuitry for synchrodyning said digitized final intermediate-frequency signal to baseband.

3. A digital television receiver as set forth in claim 2, wherein said first detector comprises:

a first multiplier which receives the first frequency-selective response and the first sample and which generates a first product signal;

a second multiplier which receives the second frequency-selective response and the second sample and which generates a second product signal; and a subtractor which combines the first product signal and the second product signal and generates the difference signal.

4. A digital television receiver as set forth in claim 3, wherein said second detector comprises:

a first delay for delaying said first portion of the descriptions by a delay corresponding to the latency time of said first filter to generate a delayed first portion of said final intermediate-frequency signal;

a second delay for delaying said second portion of the descriptions by a delay corresponding to the latency time of said second filter to generate a delayed second portion of said final intermediate-frequency signal;

a third multiplier which receives the second sample and a first multiplicand signal and which generates a third product signal;

means for applying said delayed first portion as said first multiplicand signal to said third multiplier;

a fourth multiplier which receives the first sample and a second multiplicand signal and which generates a fourth product signal;

means for applying said delayed second portion as said second multiplicand signal to said fourth multiplier; and an adder which combines said third product signal and said fourth product signal and which generates said sum signal.

5. A digital television receiver as set forth in claim 4, wherein said first sample is a digitized sample of a cosine wave of said controlled frequency, wherein said second sample is a digitized sample of a sine wave of said controlled frequency, wherein said descriptions of said final intermediate-frequency signal have a complex-number form, wherein said first portion of said descriptions is a real portion of said descriptions, and wherein said second portion of said descriptions is an imaginary portion of said descriptions.

6. A digital television receiver as set forth in claim 5, wherein said digital filter circuitry comprises:

a first Rader circuit which inputs said digitized final intermediate-frequency signal and outputs the first portion of the descriptions; and a second Rader circuit which inputs said digitized final intermediate-frequency signal and outputs the second portion of the descriptions.

7. A digital television receiver as set forth in claim 2, wherein said second detector comprises:

a first delay for delaying said first portion of the descriptions by a delay corresponding to the latency time of said first filter to generate a delayed first portion of said final intermediate-frequency signal;

a second delay for delaying said second portion of the descriptions by a delay corresponding to the latency time of said second filter to generate a delayed second portion of said final intermediate-frequency signal;

a first multiplier which receives the second sample and a first multiplicand signal and which generates a first product signal;

means for applying said delayed first portion as said first multiplicand signal to said first multiplier;

a second multiplier which receives the first sample and a second multiplicand signal and which generates a second product signal;

means for applying said delayed second portion as said second multiplicand signal to said second multiplier; and an adder which combines said first product signal and said second product signal and which generates said sum signal.

8. A digital television receiver as set forth in claim 2, wherein said first sample is a digitized sample of a cosine wave of said controlled frequency, and wherein said second sample is a digitized sample of a sine wave of said controlled frequency.

9. A digital television receiver as set forth in claim 2, wherein said descriptions of said final intermediate-frequency signal have a complex-number form, wherein said first portion of said descriptions is a real portion of said descriptions, and wherein said second portion of said descriptions is an imaginary portion of said descriptions.

10. A digital television receiver as set forth in claim 2, wherein said first and second filters center on said carrier frequency of said final intermediate-frequency signal and exhibit similar latency times.

11. A digital television receiver as set forth in claim 2, wherein said digital filter circuitry comprises:

a first Rader circuit which inputs said digitized final intermediate-frequency signal and outputs the first portion of the descriptions; and a second Rader circuit which inputs said digitized final intermediate-frequency signal and outputs the second portion of the descriptions.

12. A digital television receiver as set forth in claim 1, wherein said digital circuitry for synchrodyning said digitized final intermediate-frequency signal to baseband comprises:

a digitally controlled oscillator for generating a first sample of a controlled frequency and a second sample of said controlled frequency, said controlled frequency being controllable over a range of frequencies including the carrier frequency of said final intermediate-frequency signal in response to a digital control signal indicative of the difference of said controlled frequency from a desired frequency;

a filter having a response function which includes the carrier frequency of said final intermediate-frequency signal and which outputs a frequency-selective response;

first digital filter circuitry which is responsive to said frequency-selective response and which supplies descriptions of said frequency-selective response, wherein said descriptions include a first portion and a second portion;

a first detector which inputs said first and second portions of said descriptions and said first and second samples and which generates a corresponding difference signal indicative of the departure of the frequency and phase of said controlled frequency from the carrier frequency of said final intermediate-frequency signal;

means responsive to said difference signal for supplying said digital control signal to said digitally controlled oscillator; and a second detector which inputs said digitized final intermediate-frequency signal, said first sample, and said second sample and which outputs a corresponding sum signal which is supplied as an output signal from said digital circuitry for synchrodyning said digitized final intermediate-frequency signal to baseband.

13. A digital television receiver as set forth in claim 12, wherein said first detector comprises:

a first multiplier which receives the first portion and the first sample and which generates a first product signal;

a second multiplier which receives the second portion and the second sample and which generates a second product signal; and a subtractor which combines the first product signal and the second product signal and generates the difference signal.

14. A digital television receiver as set forth in claim 12, wherein said second detector comprises:

a delay and digital filter circuit which inputs said digitized final intermediate-frequency signal and outputs a first delay portion and a second delay portion; and a detecting circuit which inputs said first and second delay portions and said first and second samples and which generates said sum signal.

15. A digital television receiver as set forth in claim 14, wherein said delay and digital filter circuit comprises:

a first delay for delaying said digitized final intermediate-frequency signal by a delay corresponding to the latency time of said filter to produce a delayed frequency signal;

second digital filter circuitry which inputs said delayed frequency signal and outputs said first delay portion and said second delay portion.

16. A digital television receiver as set forth in claim 15, wherein said detecting circuit comprises:

a first multiplier which receives the second sample and a first multiplicand signal and which generates a first product signal;

means for applying said first delay portion as said first multiplicand signal to said first multiplier;

a second multiplier which receives the first sample and a second multiplicand signal and which generates a second product signal;

means for applying said second delay portion as said second multiplicand signal to said second multiplier; and an adder which combines said first product signal and said second product signal and which generates said sum signal.

17. A digital television receiver as set forth in claim 16, wherein said first detector comprises:

a third multiplier which receives the first portion and the first sample and which generates a third product signal;

a fourth multiplier which receives the second portion and the second sample and which generates a fourth product signal; and a subtractor which combines the third product signal and the fourth product signal and generates the difference signal.

18. A digital television receiver as set forth in claim 17, wherein said first sample is a digitized sample of a cosine wave of said controlled frequency, wherein said second sample is a digitized sample of a sine wave of said controlled frequency, wherein said descriptions of said final intermediate-frequency signal have a complex-number form, wherein said first portion of said descriptions is a real portion of said descriptions, wherein said second portion of said descriptions is an imaginary portion of said descriptions, wherein said first delay portion corresponds to a real portion of said delayed frequency signal, and wherein said second delay portion corresponds to an imaginary portion of said delayed frequency signal.

19. A digital television receiver as set forth in claim 18, wherein said first digital filter circuitry comprises:

a first Rader circuit which inputs said frequency-selective response and outputs the first portion; and a second Rader circuit which inputs said frequency-selective response and outputs the second portion, and wherein said second digital filter circuitry comprises:

a third Rader circuit which inputs said delayed frequency signal and outputs the first delay portion; and a fourth Rader circuit which inputs said delayed frequency signal and outputs the second delay portion.

20. A digital television receiver as set forth in claim 12, wherein said first sample is a digitized sample of a cosine wave of said controlled frequency, and wherein said second sample is a digitized sample of a sine wave of said controlled frequency.

21. A digital television receiver as set forth in claim 12, wherein said descriptions of said final intermediate-frequency signal have a complex-number form, wherein said first portion of said descriptions is a real portion of said descriptions, wherein said second portion of said descriptions is an imaginary portion of said descriptions, wherein said first delay portion corresponds to a real portion of said delayed frequency signal, and wherein said second delay portion corresponds to an imaginary portion of said delayed frequency signal.

22. A digital television receiver as set forth in claim 12, wherein said first digital filter circuitry comprises:

a first Rader circuit which inputs said frequency-selective response and outputs the first portion; and a second Rader circuit which inputs said frequency-selective response and outputs the second portion, and wherein said second digital filter circuitry comprises:

a third Rader circuit which inputs said delayed frequency signal and outputs the first delay portion; and a fourth Rader circuit which inputs said delayed frequency signal and outputs the second delay portion.

23. A digital television receiver as set forth in claim 1, wherein said digital circuitry for synchrodyning said digitized final intermediate-frequency signal to baseband comprises:

a digitally controlled oscillator for generating a first sample of a controlled frequency and a second sample of said controlled frequency, said controlled frequency being controllable over a range of frequencies including the carrier frequency of said final intermediate-frequency signal in response to a digital control signal indicative of the difference of said controlled frequency from a desired frequency;

digital filter circuitry responsive to said digitized final intermediate-frequency signal for supplying descriptions of said final intermediate-frequency signal, wherein said descriptions comprise a first portion and a second portion;

a first detector which inputs said first and second portions of said descriptions and said first and second samples and which generates a corresponding difference signal indicative of the departure of the frequency and phase of said controlled frequency from the carrier frequency of said final intermediate-frequency signal;

means, responsive to said difference signal, for supplying said digital control signal to said digitally controlled oscillator;

a second detector which inputs said first portion and said second portion of said descriptions and said first and second samples and which outputs a corresponding sum signal which is supplied as an output signal from said digital circuitry for synchrodyning said digitized final intermediate-frequency signal to baseband.

24. A digital television receiver as set forth in claim 23, wherein said means for supplying said digital control signal comprises a lowpass filter which is responsive to said difference signal.

25. A digital television receiver as set forth in claim 23, wherein said first detector comprises:

a first multiplier which receives said first portion of said descriptions and said first sample and which generates a first product signal;

a second multiplier which receives said second portion of said descriptions and said second sample and which generates a second product signal; and a subtractor which combines the first product signal and the second product signal and generates the difference signal.

26. A digital television receiver as set forth in claim 25, wherein said second detector comprises:

a third multiplier which receives the second sample and a first multiplicand signal and which generates a third product signal;

means for applying said first portion as said first multiplicand signal to said third multiplier;

a fourth multiplier which receives the first sample and a second multiplicand signal and which generates a fourth product signal;

means for applying said second portion as said second multiplicand signal to said fourth multiplier; and an adder which combines said third product signal and said fourth product signal and which generates said sum signal.

27. A digital television receiver as set forth in claim 26, wherein said first sample is a digitized sample of a cosine wave of said controlled frequency, wherein said second sample is a digitized sample of a sine wave of said controlled frequency, wherein said descriptions of said final intermediate-frequency signal have a complex-number form, wherein said first portion of said descriptions is a real portion of said descriptions, and wherein said second portion of said descriptions is an imaginary portion of said descriptions.

28. A digital television receiver as set forth in claim 27, wherein said digital filter circuitry comprises:

a first Rader circuit which inputs said digitized final intermediate-frequency signal and outputs the first portion of the descriptions; and a second Rader circuit which inputs said digitized final intermediate-frequency signal and outputs the second portion of the descriptions.

29. A digital television receiver as set forth in claim 23, wherein said second detector comprises:

a first multiplier which receives the second sample and a first multiplicand signal and which generates a first product signal;

means for applying said first portion as said first multiplicand signal to said first multiplier;

a second multiplier which receives the first sample and a second multiplicand signal and which generates a second product signal;

means for applying said second portion as said second multiplicand signal to said second multiplier; and an adder which combines said first product signal and said second product signal and which generates said sum signal.

30. A digital television receiver as set forth in claim 23, wherein said first sample is a digitized sample of a cosine wave of said controlled frequency, and wherein said second sample is a digitized sample of a sine wave of said controlled frequency.

31. A digital television receiver as set forth in claim 23, wherein said descriptions of said final intermediate-frequency signal have a complex-number form, wherein said first portion of said descriptions is a real portion of said descriptions, and wherein said second portion of said descriptions is an imaginary portion of said descriptions.

32. A digital television receiver as set forth in claim 23, wherein said digital filter circuitry comprises:

a first Rader circuit which inputs said digitized final intermediate-frequency signal and outputs the first portion of the descriptions; and a second Rader circuit which inputs said digitized final intermediate-frequency signal and outputs the second portion of the descriptions.

33. A digital television receiver as set forth in claim 1, wherein said digital circuitry for synchrodyning said digitized final intermediate-frequency signal to baseband comprises:

a digitally controlled oscillator for generating a first sample of a controlled frequency, a first retarded sample of said controlled frequency, a second sample of said controlled frequency, and a second retarded sample of said controlled frequency, said first retarded sample being retarded in phase from said first sample by a prescribed angle and said second retarded sample being retarded in phase from said second sample by said prescribed angle, said controlled frequency being controllable over a range of frequencies including the carrier frequency of said final intermediate-frequency signal, and said digitally controlled oscillator generating said first sample, said second sample, said first retarded sample, and said second retarded sample in response to a digital control signal indicative of the difference of said controlled frequency from a desired frequency;

digital filter circuitry responsive to said digitized final intermediate-frequency signal for supplying descriptions of said final intermediate-frequency signal; first and second filters having functions which include the carrier frequency of said final intermediate-frequency signal, said first filter providing a first frequency-selective response to a first portion of the descriptions, said second filter providing a second frequency-selective response to a second portion of the descriptions;

a first detector which inputs said first frequency-selective response, said second frequency-selective response, said first sample, and said second sample and which generates a corresponding difference signal indicative of the departure of the frequency and phase of said controlled frequency from the carrier frequency of said final intermediate-frequency signal;

means responsive to said difference signal for supplying said digital control signal to said digitally controlled oscillator; and a second detector which inputs said first portion and said second portion of said descriptions and said first and second retarded samples and which outputs a corresponding sum signal which is supplied as an output signal from said digital circuitry for synchrodyning said digitized final intermediate-frequency signal to baseband.

34. A digital television receiver as set forth in claim 33, wherein said first detector comprises:

a first multiplier which receives the first frequency-selective response and the first sample and which generates a first product signal;

a second multiplier which receives the second frequency-selective response and the second sample and which generates a second product signal; and a subtractor which combines the first product signal and the second product signal and generates the difference signal.

35. A digital television receiver as set forth in claim 34, wherein said second detector comprises:

a third multiplier which receives the second retarded sample and said first portion of said descriptions and which generates a third product signal;

a fourth multiplier which receives the first retarded sample and said second portion and which generates a fourth product signal; and an adder which combines said third product signal and said fourth product signal and which generates said sum signal.

36. A digital television receiver as set forth in claim 35, wherein said first sample is a digitized sample of a cosine wave of said controlled frequency, wherein said second sample is a digitized sample of a sine wave of said controlled frequency, wherein said descriptions of said final intermediate-frequency signal have a complex-number form, wherein said first portion of said descriptions is a real portion of said descriptions, and wherein said second portion of said descriptions is an imaginary portion of said descriptions.

37. A digital television receiver as set forth in claim 36, wherein said digital filter circuitry comprises:

a first Rader circuit which inputs said digitized final intermediate-frequency signal and outputs the first portion of the descriptions; and a second Rader circuit which inputs said digitized final intermediate-frequency signal and outputs the second portion of the descriptions.

38. A digital television receiver as set forth in claim 33, wherein said second detector comprises:

a first multiplier which receives the second retarded sample and said first portion of said descriptions and which generates a first product signal;

a second multiplier which receives the first retarded sample and said second portion and which generates a second product signal; and an adder which combines said first product signal and said second product signal and which generates said sum signal.

39. A digital television receiver as set forth in claim 33, wherein said first sample is a digitized sample of a cosine wave of said controlled frequency, and wherein said second sample is a digitized sample of a sine wave of said controlled frequency.

40. A digital television receiver as set forth in claim 33, wherein said descriptions of said final intermediate-frequency signal have a complex-number form, wherein said first portion of said descriptions is a real portion of said descriptions, and wherein said second portion of said descriptions is an imaginary portion of said descriptions.

41. A digital television receiver as set forth in claim 33, wherein said first and second filters center on said carrier frequency of said final intermediate-frequency signal and exhibit similar latency times.

42. A digital television receiver as set forth in claim 33, wherein said digital filter circuitry comprises:

a first Rader circuit which inputs said digitized final intermediate-frequency signal and outputs the first portion of the descriptions; and a second Rader circuit which inputs said digitized final intermediate-frequency signal and outputs the second portion of the descriptions.

* * * * *